United States Patent
Mori et al.

(10) Patent No.: US 11,948,865 B2
(45) Date of Patent: Apr. 2, 2024

(54) FILM-SHAPED FIRING MATERIAL AND FILM-SHAPED FIRING MATERIAL WITH A SUPPORT SHEET

(71) Applicant: LINTEC CORPORATION, Tokyo (JP)

(72) Inventors: Takeshi Mori, Tokyo (JP); Isao Ichikawa, Tokyo (JP); Hidekazu Nakayama, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 435 days.

(21) Appl. No.: 16/970,484

(22) PCT Filed: Feb. 8, 2019

(86) PCT No.: PCT/JP2019/004650
§ 371 (c)(1),
(2) Date: Aug. 17, 2020

(87) PCT Pub. No.: WO2019/163568
PCT Pub. Date: Aug. 29, 2019

(65) Prior Publication Data
US 2021/0078080 A1    Mar. 18, 2021

(30) Foreign Application Priority Data
Feb. 22, 2018   (JP) ................ 2018-029653

(51) Int. Cl.
*H01L 23/495*  (2006.01)
*B22F 1/052*  (2022.01)
(Continued)

(52) U.S. Cl.
CPC ........ *H01L 23/49513* (2013.01); *B22F 1/052* (2022.01); *B22F 1/054* (2022.01);
(Continued)

(58) Field of Classification Search
CPC .... B22F 7/04; B22F 1/10; B22F 5/006; B22F 1/052; C09J 7/38
See application file for complete search history.

(56) References Cited

U.S. PATENT DOCUMENTS 6,830,823 B1   12/2004  Kodas et al.
8,821,676 B2    9/2014  Yasuda et al.
(Continued)

FOREIGN PATENT DOCUMENTS

CN   102326460 A   1/2012
CN   106488821 A   3/2017
(Continued)

OTHER PUBLICATIONS

Grounds for Rejection dated Apr. 15, 2021 in Korean Application No. 10-2020-7023738, with English translation, 8 pages.
(Continued)

*Primary Examiner* — Ricardo D Morales
(74) *Attorney, Agent, or Firm* — Nixon & Vanderhye P.C.

(57) ABSTRACT

A film-shaped firing material (1) is provided, including first metal particles (10), second metal particles (20), and a binder component (30), in which the average particle diameter of the first metal particles (10) is 100 nm or less, and the maximum particle diameter thereof is 250 nm or less, the average particle diameter of the second metal particles (20) is in a range of 1000 to 7000 nm, the minimum particle diameter thereof is greater than 250 nm, and the maximum particle diameter thereof is 10000 nm or less, and the mass ratio of the first metal particles to the second metal particles is 0.1 or greater.

4 Claims, 2 Drawing Sheets

(51) Int. Cl.
     *B22F 1/054*   (2022.01)
     *B22F 1/10*    (2022.01)
     *B22F 1/17*    (2022.01)
     *B22F 5/00*    (2006.01)
     *B22F 7/04*    (2006.01)
     *C09J 7/38*    (2018.01)

(52) U.S. Cl.
     CPC ............... *B22F 1/056* (2022.01); *B22F 1/10* (2022.01); *B22F 5/006* (2013.01); *B22F 7/04* (2013.01); *B22F 1/17* (2022.01); *C09J 7/38* (2018.01)

(56) References Cited

U.S. PATENT DOCUMENTS

| | | | |
|---|---|---|---|
| 2017/0033073 | A1 | 2/2017 | Ghoshal et al. |
| 2020/0308456 | A1* | 10/2020 | Ichikawa ............... H01L 24/85 |

FOREIGN PATENT DOCUMENTS

| | | |
|---|---|---|
| CN | 106683738 A | 5/2017 |
| CN | 106688092 A | 5/2017 |
| CN | 107636100 A | 1/2018 |
| EP | 3711879 A1 | 9/2020 |
| JP | 2000-038608 | 2/2000 |
| JP | 2002-016345 | 1/2002 |
| JP | 2010-118280 | 5/2010 |
| JP | 2013-199686 | 10/2013 |
| JP | 2014-111800 | 6/2014 |
| JP | 2015-130417 | 7/2015 |
| JP | 2016-121329 | 7/2016 |
| JP | 2016-164864 | 9/2016 |
| JP | 2017-069558 | 4/2017 |
| JP | 2017-179551 | 10/2017 |
| JP | 2018-6735 A | 1/2018 |
| KR | 10-2015-0079857 A | 7/2015 |
| WO | WO 2014/068299 A1 | 5/2014 |

OTHER PUBLICATIONS

Extended European Search Report dated Oct. 21, 2021 in European Application No. 19757242.3, 7 pages.
Chinese Office Action dated Dec. 3, 2021 in Chinese Application No. 201980014303.X, with partial English translation (Search Report only), 11 pages.
International Search Report for PCT/JP2019/004650 dated Mar. 12, 2019, 4 pages.
Taiwanese Office Action dated Jan. 6, 2023 in Taiwanese Application No. 108105427, with English translation, 11 pages.

* cited by examiner

FILM-SHAPED FIRING MATERIAL AND FILM-SHAPED FIRING MATERIAL WITH A SUPPORT SHEET

TECHNICAL FIELD

The present invention relates to a film-shaped firing material and a film-shaped firing material with a support sheet.

This application is the U.S. national phase of International Application No. PCT/JP2019/004650 filed on Feb. 8, 2019 which designated the U.S. and claims priority is claimed on Japanese Patent Application No. 2018-29653, filed on Feb. 22, 2018, the contents of each of which are incorporated herein by reference.

BACKGROUND ART

In recent years, with the high voltage and high current of automobiles, air conditioners, and personal computers, the demand for power semiconductor elements (power devices) to be mounted on these has increased. Since a power semiconductor element is used in a high-voltage and high-current environment, generation of heat from the semiconductor element may become a problem.

In the related art, a heat sink is attached to the periphery of a semiconductor element in some cases for the purpose of heat dissipation of heat generated from the semiconductor element. However, in a case where the thermal conductivity in a portion where the heat sink and the semiconductor element are bonded is not excellent, efficient heat dissipation is affected.

As a bonding material with excellent thermal conductivity, for example, Patent Document 1 discloses a paste-like metal fine particle composition in which specific heat-sinterable metal particles, a specific polymer dispersant, and a specific volatile dispersion medium are mixed. It is considered that a solid metal with excellent thermal conductivity is obtained in a case where the composition is sintered.

Further, Patent Document 2 discloses a heat-bonding sheet which contains 60% to 98% by mass of metal fine particles, has a tensile elasticity of 10 to 3000 MPa, and has a carbon concentration of 15% by mass or less obtained by energy dispersive X-ray analysis after being heated to 400° C. in an air atmosphere.

CITATION LIST

Patent Literature

[Patent Document 1]
 Japanese Unexamined Patent Application, First Publication No. 2014-111800
[Patent Document 2]
 Japanese Unexamined Patent Application, First Publication No. 2016-121329

DISCLOSURE OF INVENTION

Technical Problem

However, in a case where a firing material is in the form of a paste as described in Patent Document 1, the thickness of the paste to be applied is unlikely to be uniform, and the thickness stability tends to be poor. Further, the paste-like metal fine particle composition described in Patent Document 1 has excellent thermal conductivity, but further improvement of thermal conductivity is required.

The heat-bonding sheet described in Patent Document 2 has excellent thickness stability, but the thermal conductivity thereof is not sufficiently satisfactory.

The present invention has been made in consideration of the above-described circumstances, and an object thereof is to provide a film-shaped firing material which has excellent thickness stability and thermal conductivity and exhibits an excellent shear adhesive force after being fired. Further, another object thereof is to provide a film-shaped firing material with a support sheet which includes the film-shaped firing material.

Solution to Problem

As a result of intensive examination conducted by the present inventors in order to achieve the above-described objects, it was found that in a case where sinterable metal particles and non-sinterable metal particles are used in combination, the non-sinterable metal particles remain in a case of sintering a firing material and thus the thermal conductivity is improved. However, it was found that a simply increase in blending amount of the non-sinterable metal particles in order to improve the thermal conductivity results in degradation of the shear adhesive force after the firing of the firing material. The present inventors have found that the balance between thermal conductivity and the shear adhesive force is excellent in a case of defining the mass ratio between the sinterable metal particles and the non-sinterable metal particles, thereby completing the present invention.

The present invention includes the following aspects.

[1] A film-shaped firing material including: first metal particles; second metal particles; and a binder component, in which the average particle diameter of the first metal particles is 100 nm or less, and the maximum particle diameter thereof is 250 nm or less, the average particle diameter of the second metal particles is in a range of 1000 to 7000 nm, the minimum particle diameter thereof is greater than 250 nm, and the maximum particle diameter thereof is 10000 nm or less, and the mass ratio of the first metal particles to the second metal particles is 0.1 or greater.

[2] The film-shaped firing material with a support sheet, including: the film-shaped firing material according to [1]; and a support sheet provided on at least one side of the film-shaped firing material.

[3] The film-shaped firing material with a support sheet according to [2], in which the support sheet includes a pressure-sensitive adhesive layer provided on a base film, and the film-shaped firing material is provided on the pressure-sensitive adhesive layer.

Advantageous Effects of Invention

According to this invention, it is possible to provide a film-shaped firing material which has excellent thickness stability and thermal conductivity and exhibits an excellent shear adhesive force after being fired. Further, it is also possible to provide a film-shaped firing material with a support sheet which includes the film-shaped firing material and is used for sinter bonding of chips of a semiconductor element or the like.

BEST MODE FOR CARRYING OUT THE INVENTION

Hereinafter, an embodiment of the present invention will be appropriately described with reference to the accompanying drawings.

Further, the drawings used in the description below are shown by enlarging main portions for convenience in order to facilitate understanding of the features of the present invention, and the dimensional ratio and the like of each constituent element are not necessarily the same as the actual ratio.

«Film-Shaped Firing Material»

A film-shaped firing material according to the present embodiment is a film-shaped firing material containing first metal particles, second metal particles, and a binder component, in which the average particle diameter of the first metal particles is 100 nm or less, and the maximum particle diameter thereof is 250 nm or less, the average particle diameter of the second metal particles is in a range of 1000 to 7000 nm, the minimum particle diameter thereof is greater than 250 nm, and the maximum particle diameter thereof is 10000 nm or less, and the mass ratio of the first metal particles to the second metal particles is 0.1 or greater.

In the present invention, the film-shaped firing material indicates the material before being fired unless otherwise specified.

Figure 1:
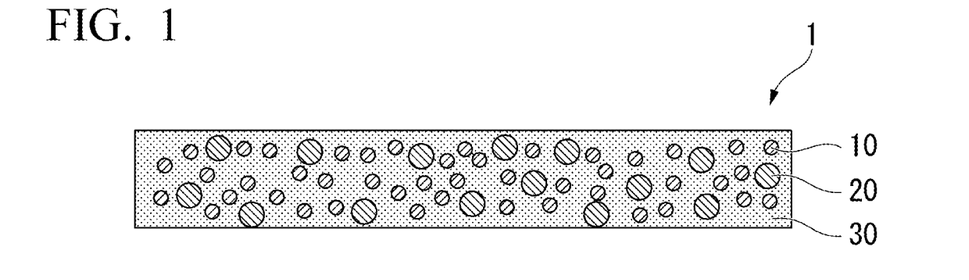
FIG. 1 is a cross-sectional view schematically showing a film-shaped firing material according to an embodiment of the present invention.

FIG. 1 is a cross-sectional view schematically showing a film-shaped firing material according to the present embodiment. A film-shaped firing material 1 contains first metal particles 10, second metal particles 20, and a binder component 30.

The film-shaped firing material may be formed of one layer (single layer) or two or more of a plurality of layers, for example, two to ten layers. In a case where the film-shaped firing material is formed of a plurality of layers, the plurality of layers may be the same as or different from one another, and a combination of the plurality of layers is not particularly limited as long as the effects of the present invention are not affected.

Further, in the present specification, the expression "the plurality of layers may be the same as or different from one another" means that "all layers may be the same as one another, all layers may be different from one another, or only some layers may be the same as one another" and the expression "the plurality of layers are different from one another" means that "at least one of the constituent materials of each layer, the compounding ratios of constituent materials, and the thicknesses of layers are different from one another" without limiting to the case of the film-shaped firing material.

The thickness of the film-shaped firing material before being fired is not particularly limited, but is preferably in a range of 10 to 200 µm, preferably in a range of 20 to 150 µm, and more preferably in a range of 30 to 90 µm.

Here, the "thickness of the film-shaped firing material" indicates the thickness of the entire film-shaped firing material. For example, the thickness of the film-shaped firing material formed of a plurality of layers indicates the total thickness of all layers constituting the film-shaped firing material.

In the present specification, the "thickness" can be acquired using a constant pressure thickness-measuring device in conformity with JIS K7130 as a value obtained by averaging the measured thicknesses at five optional sites.

(Release Film)

The film-shaped firing material can be provided in a state of being laminated on a release film. At the time of use, the release film may be peeled off and disposed on an object to which the film-shaped firing material is sinter-bonded. The release film also has a function as a protective film to prevent damage to the film-shaped firing material and adhesion of dirt. The release film may be provided on at least one side of the film-shaped firing material or on both sides of the film-shaped firing material. In a case where the release film is provided on both sides of the film-shaped firing material, the release film on one side functions as a support sheet.

Examples of the release film include transparent films such as a polyethylene film, a polypropylene film, a polybutene film, a polybutadiene film, a polymethyl pentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. Further, crosslinked films of these are also used. Further, laminated films of these may also be used. Further, films obtained by coloring these films and opaque films can also be used. Examples of a release agent include a silicone-based release agent, a fluorine-based release agent, an olefin-based release agent, an alkyd-based release agent, and a long-chain alkyl group-containing carbamate.

The thickness of the release film is typically in a range of 10 to 500 µm, preferably in a range of 15 to 300 µm, and particularly preferably in a range of 20 to 250 µm.

<First Metal Particles>

The average particle diameter of the first metal particles is 100 nm or less.

The metal particles having an average particle diameter of 100 nm or less exhibit sinterability. That is, the first metal particles are metal particles which can be fused and bonded to form a sintered body by being subjected to a heat treatment at a temperature of the melting point of the metal particles or higher as firing of the film-shaped firing material. The formation of the sintered body enables sinter bonding of the film-shaped firing material and a fired product in contact with the film-shaped firing material. Specifically, the chips and the substrate can be sinter-bonded through the film-shaped firing material.

In the present invention, the first metal particles are also referred to as "sinterable metal particles".

The average particle diameter of the first metal particles contained in the film-shaped firing material is preferably in a range of 0.1 to 100 nm, more preferably in a range of 0.5 to 80 nm, and still more preferably in a range of 1 to 60 nm. In a case where the average particle diameter of the first metal particles is less than or equal to the above-described upper limit, the meltability is excellent, and the heat sintering at a low temperature can be carried out. Meanwhile, in a case where the average particle diameter of the first metal particles is greater than or equal to the above-described lower limit, the particles can be easily handled, and scattering of the particles in a case of blending the particles with the binder component can be suppressed. Further, the state of dispersion of the particles in a firing material composition described below becomes satisfactory.

Further, the maximum particle diameter of the first metal particles contained in the film-shaped firing material is 250 nm or less, preferably 200 nm or less, and more preferably 150 nm or less. In a case where the maximum particle diameter of the first metal particles is less than or equal to the above-described upper limit, the solubility is more excellent.

Further, the minimum particle diameter of the first metal particles contained in the film-shaped firing material is preferably 0.01 nm or greater, more preferably 0.1 nm or greater, and still more preferably 1 nm or greater. In a case where the minimum particle diameter of the first metal particles is greater than or equal to the above-described lower limit, the particles can be easily handled, and scattering of the particles in a case of blending the particles with the binder component can be suppressed. Further, the state of dispersion of the particles in the firing material composition becomes satisfactory.

For example, the particle diameter of the first metal particles contained in the film-shaped firing material may be in a range of 0.01 nm to 250 nm, in a range of 0.01 nm to 200 nm, in a range of 0.01 nm to 150 nm, in a range of 0.1 nm to 250 nm, in a range of 0.1 nm to 200 nm, in a range of 0.1 nm to 150 nm, in a range of 1 nm to 250 nm, in a range of 1 nm to 200 nm, or in a range of 1 nm to 150 nm.

In the present specification, the "particle diameter of the metal particles" is a projected area circle equivalent diameter of the particle diameter of the metal particles observed using a scanning electron microscope (SEM) or a transmission electron microscope (TEM). Specifically, the particle diameter of the first metal particles is measured using a TEM, and the particle diameter of the second metal particles is measured using a SEM.

Further, the "average particle diameter" indicates a particle diameter (D50) at an integrated value of 50% in a particle size distribution curve acquired according to an image analysis method using a SEM image or a TEM image, unless otherwise specified.

The "minimum particle diameter" indicates the smallest particle diameter observed from a SEM image or a TEM image, and the "maximum particle diameter" indicates the largest particle diameter observed from a SEM image or a TEM image.

Examples of the metal species of the first metal particles include silver, gold, copper, iron, nickel, aluminum, silicon, palladium, platinum, titanium, barium titanate, and oxides or alloys thereof. Among these, silver and silver oxide are preferable. Only one kind of metal or a combination of two or more kinds of metals may be blended into the first metal particles.

As the first metal particles, silver particles and copper particles are preferable from the viewpoints of exhibiting excellent thermal conductivity even in a case where only a small amount of particles are present and being advantageous in terms of cost.

The surface of each first metal particle may be coated with an organic substance. In a case where the film-shaped firing material has a film coated with an organic substance, the compatibility with a binder component is improved. Further, aggregation of particles can be prevented, and the particles can be uniformly dispersed. Particularly, from the viewpoint that the dispersibility and the filling property (packing property) of a coating film after sintering are excellent, cracks are unlikely to occur in the film-shaped firing material, and the thermal conductivity can be satisfactorily maintained, metal particles whose surfaces are modified with organic chains chemically bonded with metal alkoxide are preferable.

In a case where the surface of each first metal particle is coated with an organic substance, the mass of the first metal particle is set as a value of the mass including the coated substance.

Since the first metal particles are set to be in a state in which aggregates are eliminated in advance before binder components and other additive components described below are mixed with the first metal particles, the first metal particles may be dispersed in a high-boiling point solvent having a high boiling point, such as isobornyl cyclohexanol or decyl alcohol. The boiling point of the high-boiling point solvent may be, for example, in a range of 200° C. to 350° C. In a case where the high-boiling point solvent is used, since the solvent is unlikely to volatilize at room temperature, an increase in concentration of the first metal particles is prevented, the workability is improved, and the re-aggregation and the like of the first metal particles are also prevented so that the quality thereof becomes satisfactory. As the dispersion method, the dispersion may be carried out using a kneader, a triple roll, a bead mill, or ultrasonic waves.

<Second Metal Particle>

The average particle diameter of the second metal particles is in a range of 1000 to 7000 nm.

The metal particles having an average particle diameter of 1000 nm or greater are non-sinterable metal particles that are unlikely to exhibit sinterability. Therefore, even in a case where the film-shaped firing material is fired, the shape thereof is maintained and remains in the film-shaped firing material after the firing.

In the present invention, the second metal particles are also referred to as "non-sinterable metal particles".

The average particle diameter of the second metal particles contained in the film-shaped firing material is in a range of 1000 to 7000 nm, preferably in a range of 1250 to 6000 nm, and more preferably in a range of 1500 to 5000 nm. In a case where the average particle diameter of the second metal particles is less than or equal to the above-described upper limit, the second metal particles are unlikely to be precipitated or aggregated in the firing material composition described below. In a case where the particles are significantly aggregated, metal particles (aggregates) that are aggregated at the time of processing the firing material composition into the film-shaped firing material are visually recognized. In addition, unevenness occurs in the surface of the firing material due to the metal particles alone or aggregates, and the surface is likely to be non-uniform. Further, the shear adhesive force may be decreased due to uneven distribution of metal particles alone or aggregates at the adhesive interface with an adherend (for example, a chip or a base material). In a case where the average particle diameter of the second metal particles is less than or equal to the above-described upper limit, non-uniformity of the surface of the firing material due to metal particles alone or aggregates can be suppressed. In addition, the shear adhesive force after the firing increases. Meanwhile, in a case where the average particle diameter of the second metal particles is greater than or equal to the above-described lower limit, the thermal conductivity is excellent.

The minimum particle diameter of the second metal particles contained in the film-shaped firing material is greater than 250 nm, preferably 350 nm or greater, and more preferably 450 nm or greater. In a case where the minimum particle diameter of the second metal particles is greater than or equal to the lower limit, the non-meltability is excellent, and even in a case where the film-shaped firing material is fired, the shape thereof is maintained and remains in the film-shaped firing material after the firing.

Further, the maximum particle diameter of the second metal particles contained in the film-shaped firing material is 10000 nm or less, preferably 9000 nm or less, and more preferably 8000 nm or less. In a case where the maximum particle diameter of the second metal particles is less than or equal to the above-described upper limit, the particles are unlikely to be precipitated in the firing material composition, and thus non-uniformity of the surface of the firing material due to the metal particles alone or aggregates at the time of processing the firing material composition into the film-shaped firing material can be further suppressed.

For example, the particle diameter of the second metal particles contained in the film-shaped firing material may be greater than 250 nm and 10000 nm or less, greater than 250 nm and 9000 nm or less, greater than 250 nm and 8000 nm or less, in a range of 350 nm to 10000 nm, in a range of 350 nm to 9000 nm, in a range of 350 nm to 8000 nm, in a range of 450 nm to 10000 nm, in a range of 450 nm to 9000 nm, or in a range of 450 nm to 8000 nm.

Examples of the metal species of the second metal particles include the same metal species as those for the first metal particles. Further, silver particles and copper particles are preferable from the viewpoints of exhibiting excellent thermal conductivity even in a case where only a small amount of particles are present and being advantageous in terms of cost.

The surface of each second metal particle may be coated with an organic substance. In a case where the film-shaped firing material has a film coated with an organic substance, the compatibility with a binder component is improved. Further, aggregation of particles can be prevented, and the particles can be uniformly dispersed. Particularly, from the viewpoint that the dispersibility and the filling property (packing property) of a coating film after sintering are excellent, cracks are unlikely to occur in the film-shaped firing material, and the thermal conductivity can be satisfactorily maintained, metal particles whose surfaces are modified with organic chains chemically bonded with metal alkoxide are preferable.

In a case where the surface of each second metal particle is coated with an organic substance, the mass of the first metal particle is set as a value of mass including the coated substance.

Since the second metal particles are set to be in a state in which aggregates are eliminated in advance before binder components and other additive components described below are mixed with the second metal particles, the second metal particles may be dispersed in a high-boiling point solvent having a high boiling point, such as isobornyl cyclohexanol or decyl alcohol. The boiling point of the high-boiling point solvent may be, for example, in a range of 200° C. to 350° C. In a case where the high-boiling point solvent is used, since the solvent is unlikely to volatilize at room temperature, an increase in concentration of the second metal particles is prevented, the workability is improved, and the re-aggregation and the like of the second metal particles are also prevented so that the quality thereof becomes satisfactory. As the dispersion method, the dispersion may be carried out using a kneader, a triple roll, a bead mill, or ultrasonic waves.

<Binder Component>

In a case where a binder component is blended into the film-shaped firing material, the firing material can be formed in a film shape, and tackiness can be imparted to the film-shaped firing material before being fired. The binder component may be thermally decomposable, that is, thermally decomposed by being subjected to a heat treatment as firing of the film-shaped firing material.

The binder component is not particularly limited, and suitable examples of the binder component include resins. Examples of the resins include an acrylic resin, a polycarbonate resin, polylactic acid, and a polymer of a cellulose derivative. Among these, an acrylic resin is preferable. The acrylic resin includes a homopolymer of a (meth)acrylate compound, two or more copolymers of a (meth)acrylate compound, and a copolymer of a (meth)acrylate compound and another copolymer monomer.

The amount of the constituent unit derived from the (meth)acrylate compound in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Here, the term "derived" means that the monomer has undergone a structural change necessary for polymerization.

Specific examples of the (meth)acrylate compound include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate;

hydroxyalkyl (meth)acrylate such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate or 3-hydroxybutyl (meth)acrylate;

phenoxyalkyl (meth)acrylate such as phenoxyethyl (meth)acrylate, 2-hydroxy-3-phenoxypropyl (meth)acrylate;

alkoxyalkyl (meth)acrylate such as 2-methoxyethyl (meth)acrylate, 2-ethoxyethyl (meth)acrylate, 2-propoxyethyl (meth)acrylate, 2-butoxyethyl (meth)acrylate, or 2-methoxybutyl (meth)acrylate;

polyalkylene glycol (meth)acrylate such as polyethylene glycol mono(meth)acrylate, ethoxy diethylene glycol (meth)acrylate, methoxy polyethylene glycol (meth)acrylate, phenoxy polyethylene glycol (meth)acrylate, nonyl phenoxy polyethylene glycol (meth)acrylate, polypropylene glycol mono(meth)acrylate, methoxy polypropylene glycol (meth)acrylate, ethoxy polypropylene glycol (meth)acrylate, or nonyl phenoxy polypropylene glycol (meth)acrylate;

cycloalkyl (meth)acrylate such as cyclohexyl (meth)acrylate, 4-butyl cyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate, or tricyclodecanyl (meth)acrylate; and benzyl (meth)acrylate, and tetrahydrofurfuryl (meth)acrylate. Among these, alkyl (meth)acrylate or alkoxyalkyl (meth)acrylate is preferable. As a particularly preferable (meth)acrylate compound, butyl (meth)acrylate, ethylhexyl (meth)acrylate, lauryl (meth)acrylate, isodecyl (meth)acrylate, 2-ethylhexyl (meth)acrylate, and 2-ethoxyethyl (meth)acrylate are exemplified.

In the present specification, the concept of "(meth)acrylate" includes both of "acrylate" and "methacrylate".

As an acrylic resin, methacrylate is preferable. In a case where the binder component has a constituent unit derived from methacrylate, the film-shaped firing material can be fired at a relatively low temperature, and the conditions for sufficiently obtaining the adhesive strength after the material is sintered can be easily satisfied.

The amount of the constituent unit derived from methacrylate in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Another copolymer monomer is not particularly limited as long as the compound can be copolymerized with the (meth)acrylate compound, and examples thereof include unsaturated carboxylic acids such as (meth)acrylic acid, vinyl benzoic acid, maleic acid, and vinyl phthalic acid; and a vinyl group-containing radically polymerizable compound such as vinyl benzyl methyl ether, vinyl glycidyl ether, styrene, α-methylstyrene, butadiene, or isoprene.

The mass-average molecular weight (Mw) of the resin constituting the binder component is preferably in a range of 1000 to 1000000 and more preferably in a range of 10000 to 800000. In a case where the mass average molecular weight of the resin is in the above-described range, the film exhibits sufficient film hardness, and the flexibility can be easily imparted to the film.

In the present specification, the "mass average molecular weight" is a value in terms of polystyrene which is measured according to the gel permeation chromatography (GPC) method unless otherwise specified.

The glass transition temperature (Tg) of the resin constituting the binder component is preferably in a range of −60° C. to 50° C., more preferably in a range of −30° C. to 10° C., and still more preferably −20° C. or higher and lower than 0° C. In a case where the Tg of the resin is lower than or equal to the above-described upper limit, the adhesive force before the firing between the film-shaped firing material and the adherend is improved. In addition, the flexibility of the film-shaped firing material is improved. Further, in a case where the Tg of the resin is higher than or equal to the above-described lower limit, the film shape can be maintained, and the film-shaped firing material is more easily pulled apart from the support sheet or the like.

In the present specification, "the glass transition temperature (Tg)" is a temperature of an inflection point of a DSC curve obtained by measuring the DSC curve of a sample using a differential scanning calorimeter.

The binder component may be thermally decomposable, that is, thermally decomposed by being subjected to a heat treatment as firing of the film-shaped firing material. The thermal decomposition of the binder component can be confirmed from a decrease in mass of the binder component due to firing. Further, a component to be blended as the binder component may be almost thermally decomposed due to firing, but the entire component to be blended as the binder component may not be thermally decomposed due to firing.

The mass of the binder component after being fired may be 10% by mass or less, 5% by mass or less, 3% by mass or less, or 0% by mass with respect to the total mass (100% by mass) of the binder component before being fired.

<Other Additives>

In addition to the first metal particles, the second metal particles, and the binder component, the film-shaped firing material according to the present embodiment may contain other additives that do not correspond to the first metal particles, the second metal particles, and the binder component, within a range where the effects of the present invention are not affected.

Examples of other additives which may be contained in the film-shaped firing material according to the present embodiment include a solvent, a dispersant, a plasticizer, a tackifier, a storage stabilizer, an antifoaming agent, a thermal decomposition accelerator, and an antioxidant. The film-shaped firing material may contain only one or two or more kinds of additives. These additives are not particularly limited and can be appropriately selected from those which have been typically used in this field.

<Composition>

The film-shaped firing material according to the present embodiment may be formed of the first metal particles, the second metal particles, the binder component, and other additives, and the total content (% by mass) of these is 100% by mass.

In the film-shaped firing material, the mass ratio (first metal particles/second metal particles) of the first metal particles to the second metal particles is 0.1 or greater, preferably 0.2 or greater, and more preferably 0.4 or greater. In a case where the proportion of the first metal particles is extremely small, voids are likely to be formed in the film-shaped firing material after the firing, and the voids may cause degradation of the thermal conductivity and the shear adhesive force. In a case where the mass ratio of the first metal particles to the second metal particles is greater than or equal to the above-described lower limit, the amount of the first metal particles can be sufficiently ensured. Therefore, a film-shaped firing material in which voids are unlikely to be formed even in a case of firing the material is obtained, and the thermal conductivity and the shear adhesive force are increased.

The mass ratio of the first metal particles to the second metal particles is preferably 100 or less, more preferably 50 or less, and still more preferably 25 or less.

For example, the mass ratio of the first metal particles to the second metal particles is may be in a range of 0.1 to 100, in a range of 0.1 to 50, in a range of 0.1 to 25, in a range of 0.2 to 100, in a range of 0.2 to 50, in a range of 0.2 to 25, in a range of 0.4 to 100, in a range of 0.4 to 50, or in a range of 0.4 to 25.

The total amount of the first metal particles and the second metal particles is preferably in a range of 50% to 99% by mass, more preferably in a range of 70% to 97% by mass, and still more preferably in a range of 80% to 95% by mass with respect to the total mass (100% by mass) of all components other than the solvent (hereinafter, also noted as the "solid content") in the film-shaped firing material.

The amount of the binder component is preferably in a range of 1% to 50% by mass, more preferably in a range of 3% to 30% by mass, and still more preferably in a range of 5% to 20% by mass with respect to the total mass (100% by mass) of the solid content in the film-shaped firing material.

In a case where the amount of the binder component is less than or equal to the above-described upper limit, the amount of the first metal particles and the second metal particles can be sufficiently ensured, and thus the adhesive force between the film-shaped firing material and the adherend is improved. In a case where the amount of the binder component is greater than or equal to the above-described lower limit, the film shape can be maintained.

The film-shaped firing material may contain the above-described high-boiling point solvent used in a case of mixing the first metal particles, the second metal particles, the binder component, and other additive components. The amount of the high-boiling point solvent is preferably 20% by mass or less, more preferably 15% by mass or less, and still more preferably 10% by mass or less with respect to the total mass (100% by mass) of the film-shaped firing material.

According to the film-shaped firing material of the above-described embodiment, the thickness stability is excellent because the material is in the form of a film. Further, since the film-shaped firing material of the present embodiment contains the first metal particles which are sinterable metal particles and the second metal particles which are non-sinterable metal particles at a specific mass ratio, voids are unlikely to be formed in the film-shaped firing material after the firing, and the thermal conductivity and the shear adhesive force are excellent. Further, since the average particle diameter of the second metal particles contained in the film-shaped firing material according to the present embodiment is greater than 100 nm and 10000 nm or less, the second metal particles are unlikely to be aggregated and can be uniformly dispersed. Therefore, the film-shaped firing material according to the present embodiment can exhibit an excellent shear adhesive force after the firing.

According to the film-shaped firing material of the present embodiment, a thermal conductivity of 300 W/(m·K) or greater is easily exhibited. Further, according to the film-shaped firing material of the present embodiment, a shear adhesive force of 25 MPa or greater is easily exhibited. The methods for measuring the thermal conductivity and the shear adhesive force are as described in examples described below.

The film-shaped firing material can be made into a film-shaped firing material with a support sheet, in which the support sheet is provided on at least one side (surface) thereof.

The details of the film-shaped firing material with a support sheet are as follows.

«Method of Producing Film-Shaped Firing Material»

The film-shaped firing material can be formed using a firing material composition containing this constituent material. For example, the film-shaped firing material can be formed in a target portion by coating or printing a surface on which the film-shaped firing material is formed with the firing material composition containing a solvent and each component for constituting the film-shaped firing material and volatilizing the solvent as necessary.

Examples of the surface on which the film-shaped firing material is formed include a surface of a release film.

As the solvent in a case where the surface is coated with the firing material composition, a solvent having a boiling point of lower than 200° C. is preferable. Examples thereof include n-hexane (boiling point: 68° C.), ethyl acetate (boiling point: 77° C.), 2-butanone (boiling point: 80° C.), n-heptane (boiling point: 98° C.), methyl cyclohexane (boiling point: 101° C.), toluene (boiling point: 111° C.), acetyl acetone (boiling point: 138° C.), n-xylene (boiling point: 139° C.), and dimethylformamide (boiling point: 153° C.). These solvents may be used alone or in combination.

The surface thereof may be coated with the firing material composition using a known method, and examples of the method include methods of using various coaters such as an air knife coater, a blade coater, a bar coater, a gravure coater, a Comma coater (registered trademark), a roll coater, a roll knife coater, a curtain coater, a die coater, a knife coater, a screen coater, a Meyer bar coater, and a kiss coater.

In a case where the surface is printed with the firing material composition, the solvent may be volatilized and dried after the printing, and the boiling point thereof is preferably in a range of 65° C. to 350° C. Examples of such a solvent include the above-described solvent having a boiling point of lower than 200° C., isophorone (boiling point: 215° C.), butyl carbitol (boiling point: 230° C.), 1-decanol (boiling point: 233° C.), butyl carbitol acetate (boiling point: 247° C.), and isobornyl cyclohexanol (boiling point: 318° C.).

In a case where the boiling point is higher than 350° C., at the time of volatilizing and drying the solvent after the printing, the solvent is unlikely to be volatilized, and a desired shape is unlikely to be ensured. Further, the solvent at the time of firing the material remains in the film, and thus the bonding adhesiveness may deteriorate. In a case where the boiling point is lower than 65° C., the solvent is volatilized during the printing, and thus the thickness stability may be impaired. In a case where a solvent having a boiling point of 200° C. to 350° C. is used, an increase in viscosity due to the volatilization of the solvent during the printing can be suppressed. Therefore, the printing suitability can be obtained.

The printing of the firing material composition can be performed according to a known printing method, for example, relief printing such as flexo printing, intaglio printing such as gravure printing, planographic printing such as offset printing, screen printing such as silk screen printing or rotary screen printing, or printing using various printers such as an ink jet printer.

The shape of the film-shaped firing material may be appropriately set according to the target shape of sinter bonding, and a circular shape or a rectangular shape is preferable. The circular shape is a shape corresponding to the shape of the semiconductor wafer. The rectangular shape is a shape corresponding to the shape of the chip. The corresponding shape may be the same or approximately the same as the target shape of sinter bonding.

In a case where the film-shaped firing material has a circular shape, the area of the circle may be in a range of 3.5 to 1600 $cm^2$ or in a range of 85 to 1400 $cm^2$. In a case where the film-shaped firing material has a rectangular shape, the area of the rectangle may be in a range of 0.01 to 25 $cm^2$ or in a range of 0.25 to 9 $cm^2$.

From the viewpoint that the film-shaped firing material is easily processed into a desired shape, it is preferable that the film-shaped firing material is produced by performing printing using a firing material composition and more preferable that the film-shaped firing material is produced by performing screen printing.

The condition for drying the firing material composition is not particularly limited, but it is preferable that the firing material composition be dried by being heated in a case where the firing material composition contains a solvent. In this case, it is preferable that the firing material composition be dried, for example, in a temperature range of 70° C. to 250° C. or in a temperature range of 80° C. to 180° C. for 10 seconds to 10 minutes.

The film-shaped firing material according to the present embodiment is a film-shaped firing material containing the first metal particles, the second metal particles, and the binder component, in which the average particle diameter of the first metal particles is 100 nm or less, and the maximum particle diameter thereof is 250 nm or less, the average particle diameter of the second metal particles is in a range of 1000 to 7000 nm, the minimum particle diameter thereof is greater than 250 nm, and the maximum particle diameter thereof is 10000 nm or less, and the mass ratio of the first metal particles to the second metal particles is 0.1 or greater, but a film-shaped firing material in which the average particle diameter of the first metal particles is in a range of 0.5 to 80 nm, the maximum particle diameter thereof is 250 nm or less, and the minimum particle diameter thereof is 0.5 nm or greater, the average particle diameter of the second metal particles is in a range of 1500 to 5000 nm, the maximum particle diameter thereof is 10000 nm or less, and the minimum particle diameter thereof is 450 nm or greater, and the mass ratio of the first metal particles to the second metal particles is in a range of 0.2 to 25 is preferable.

Further, a film-shaped firing material in which the total amount of the first metal particles and the second metal particles is in a range of 80% to 95% by mass with respect to the total mass (100% by mass) of the solid content in the film-shaped firing material and the amount of the binder component is in a range of 5% to 20% by mass is preferable as the film-shaped firing material according to the present embodiment.

«Film-Shaped Firing Material with a Support Sheet»

A film-shaped firing material with a support sheet according to the present embodiment includes the above-described film-shaped firing material and a support sheet provided on at least one side (surface) of the film-shaped firing material. The support sheet is formed such that a pressure-sensitive adhesive layer is provided on the entire surface or the outer peripheral portion of a base film, and it is preferable that the film-shaped firing material is provided on the pressure-sensitive adhesive layer. The film-shaped firing material may be provided by being brought into direct contact with the pressure-sensitive adhesive layer or provided by being brought into direct contact with the base film. By employing the present form, the material can be used as a dicing sheet used at the time of dividing a semiconductor wafer into chips. Further, the film-shaped firing material having the same shape as the shape of chip can be processed by being divided together with the semiconductor wafer using a blade or the like, and a chip with the film-shaped firing material can be produced.

Figure 2:
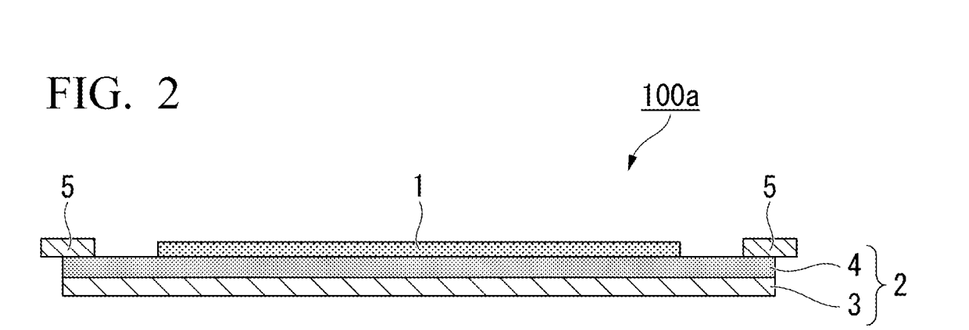
FIG. 2 is a cross-sectional view schematically showing a state in which a film-shaped firing material with a support sheet according to an embodiment of the present invention is attached to a ring frame.
Figure 3:
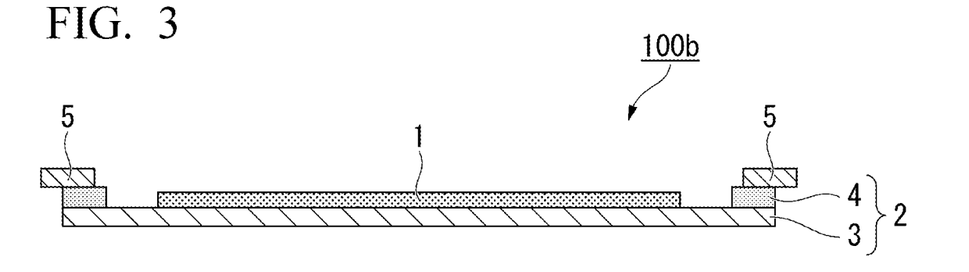
FIG. 3 is a cross-sectional view schematically showing a state in which a film-shaped firing material with a support sheet according to an embodiment of the present invention is attached to a ring frame.

Hereinafter, an embodiment of the film-shaped firing material with a support sheet will be described. FIGS. 2 and 3 are cross-sectional views schematically showing the film-shaped firing material with a support sheet according to the present embodiment. As shown in FIGS. 2 and 3, film-shaped firing materials with a support sheet 100a and 100b according to the present embodiment are formed such that the film-shaped firing material 1 is temporarily and peelably attached to the inner peripheral portion of a support sheet 2 having a pressure-sensitive adhesive portion on the outer peripheral portion. As shown in FIG. 2, the support sheet 2 is a pressure-sensitive adhesive sheet having a pressure-sensitive adhesive layer 4 on the upper surface of a base film 3, and the surface of the inner peripheral portion of the pressure-sensitive adhesive layer 4 is covered with the film-shaped firing material to expose the pressure-sensitive adhesive portion to the outer peripheral portion. Further, as shown in FIG. 3, the support sheet 2 may include a ring-shaped pressure-sensitive adhesive layer 4 on the outer peripheral portion of the base film 3.

The film-shaped firing material 1 is formed in approximately the same shape as the shape of a workpiece (a semiconductor wafer or the like) to be attached to the inner peripheral portion of the support sheet 2. The support sheet 2 has a pressure-sensitive adhesive portion on the outer peripheral portion. According to a preferable aspect, the film-shaped firing material 1 having a diameter smaller than the diameter of the support sheet 2 is concentrically laminated on the circular support sheet 2. The pressure-sensitive adhesive portion on the outer peripheral portion is used for fixing a ring frame 5 as shown in the figure.

(Base Film)

The base film 3 is not particularly limited, and examples thereof include films formed of low density polyethylene (LDPE), linear low density polyethylene (LLDPE), an ethylene-propylene copolymer, polypropylene, polybutene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride-vinyl acetate copolymer, a polyurethane film, and an ionomer. In the present specification, "(meth)acryl" includes both acryl and methacryl.

Further, in a case where the support sheet is required to have high heat resistance, examples of the base film 3 include a polyester film such as polyethylene terephthalate, polybutylene terephthalate, or polyethylene naphthalate, and a polyolefin film such as polypropylene or polymethyl pentene. In addition, crosslinked films of these or modified films using radiation, electric discharge, and the like can also be used. The base film may be a laminate of the above-described films.

Further, these films can be used by laminating two or more films thereof or by combining the films. Further, films obtained by coloring these films or performing printing thereon can also be used. Further, the films may be formed into a sheet by performing extrusion molding a thermoplastic resin or may be stretched. Further, films formed into a sheet by thinning and curing a curable resin through predetermined means may be used.

The thickness of the base film is not particularly limited, but is preferably in a range of 30 to 300 μm and more preferably in a range of 50 to 200 μm. By setting the thickness of the base film to be in the above-described range, rupture of the base film is unlikely to occur even in a case where cutting is performed by means of dicing. Further, since the flexibility is sufficiently imparted to the film-shaped firing material with a support sheet, the film-shaped firing material exhibits satisfactory adhesiveness to a workpiece (for example, a semiconductor wafer).

The base film can be obtained by coating the surface with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

(Pressure-Sensitive Adhesive Layer)

The support sheet 2 has a pressure-sensitive adhesive portion on at least the outer peripheral portion thereof. It is preferable that the pressure-sensitive adhesive portion have a function of temporarily fixing the ring frame 5 on the outer peripheral portions of film-shaped with a support sheet firing materials 100a and 100b, and the ring frame 5 is peelable after required steps are carried out. Therefore, as the pressure-sensitive adhesive layer 4, a layer with low tackiness may be used, or an energy ray curable layer having an adhesive force which is decreased at the time of irradiation with energy rays may be used. A repeelable pressure-sensitive adhesive layer can be formed using various known pressure-sensitive adhesives (for example, a general purpose pressure-sensitive adhesive such as a rubber-based pressure-sensitive adhesive, an acrylic pressure-sensitive adhesive, a silicone-based pressure-sensitive adhesive, a urethane-based pressure-sensitive adhesive, or a polyvinyl ether-based pressure-sensitive adhesive, a pressure-sensitive adhesive with surface unevenness, an energy ray curable pressure-sensitive adhesive, or a thermal expansion component-containing pressure-sensitive adhesive).

The support sheet 2 is a pressure-sensitive adhesive sheet having a typical configuration provided with the pressure-sensitive adhesive layer 4 on the entire upper surface of the base film 3 as shown in FIG. 2. Alternatively, the support sheet may have a configuration in which the surface of the pressure-sensitive adhesive layer 4 on the inner peripheral portion is covered with the film-shaped firing material and the pressure-sensitive adhesive portion is exposed to the outer peripheral portion. In this case, the outer peripheral portion of the pressure-sensitive adhesive layer 4 is used for fixing the above-described ring frame 5, and the film-shaped firing material is peelably laminated on the inner peripheral portion. As the pressure-sensitive adhesive layer 4, a layer with low tackiness may be used in the same manner as described above, or an energy ray curable pressure-sensitive adhesive may be used.

In the configuration shown in FIG. 3, the ring-shaped pressure-sensitive adhesive layer 4 is formed on the outer peripheral portion of the base film 3 and is set as a pressure-sensitive adhesive portion. At this time, the pressure-sensitive adhesive layer 4 may be a single pressure-sensitive adhesive layer formed of the above-described pressure-sensitive adhesive or may be obtained by circularly cutting double-sided pressure-sensitive adhesive tape containing a pressure-sensitive adhesive layer formed of the above-described pressure-sensitive adhesive.

As a weak pressure-sensitive adhesive, an acrylic pressure-sensitive adhesive or a silicone-based pressure-sensitive adhesive is preferably used. Further, in consideration of the peelability of the film-shaped firing material, the adhesive force of the pressure-sensitive adhesive layer 4 on a SUS plate at 23° C. is preferably in a range of 30 to 120 mN/25 mm, more preferably in a range of 50 to 100 mN/25 mm, and still more preferably in a range of 60 to 90 mN/25 mm. In a case where the adhesive force is extremely low, the ring frame may drop off. Further, in a case where the adhesive force is extremely high, the pressure-sensitive adhesive layer is unlikely to be peeled off from the ring frame, and thus the ring frame is unlikely to be reused.

In a case where a repeelable pressure-sensitive adhesive layer which is curable by energy rays is used in the support sheet with the configuration of FIG. 2, the tackiness may be decreased by irradiating a region where the film-shaped firing material is laminated with energy rays in advance. At this time, the adhesive force in other regions may be maintained to be high without performing irradiation with energy rays for the purpose of bonding the ring frame 5. In order to not irradiate other regions with energy rays, for example, irradiation with energy rays may be performed from the base film side by providing an energy ray shielding layer in regions corresponding to other regions of the base film through printing or the like. In the support sheet with the configuration of FIG. 2, the surface where the pressure-sensitive adhesive layer 4 of the base film 3 is provided can be subjected to a roughening treatment such as sand blasting or a solvent treatment or an oxidation treatment such as a corona discharge treatment, irradiation with electron beams, a plasma treatment, an ozone ultraviolet irradiation treatment, a flame treatment, a chromic acid treatment, or a hot air treatment as desired, for the purpose of strengthening bonding between the base film 3 and the pressure-sensitive adhesive layer 4. In addition, a primer treatment can be performed.

The thickness of the pressure-sensitive adhesive layer 4 is not particularly limited, but is preferably in a range of 1 to 100 μm, more preferably in a range of 2 to 80 μm, and particularly preferably in a range of 3 to 50 μm.

(Film-Shaped Firing Material with a Support Sheet)

The film-shaped firing material with a support sheet is formed such that the film-shaped firing material is temporarily and peelably attached to the inner peripheral portion of a support sheet having a pressure-sensitive adhesive portion on the outer peripheral portion. In the configuration example shown in FIG. 2, the film-shaped firing material with a support sheet 100a is formed such that the film-shaped firing material 1 is peelably laminated on the inner peripheral portion of the support sheet 2 formed of the base film 3 and the pressure-sensitive adhesive layer 4, and the pressure-sensitive adhesive layer 4 is exposed to the outer peripheral portion of the support sheet 2. In this configuration example, it is preferable that the film-shaped firing material 1 having a diameter smaller than the diameter of the support sheet 2 is concentrically and peelably laminated on the pressure-sensitive adhesive layer 4 of the support sheet 2.

The film-shaped firing material with a support sheet 100a which has the above-described configuration is attached to the ring frame 5 in the pressure-sensitive adhesive layer 4 exposed to the outer peripheral portion of the support sheet 2.

Further, cyclic double-sided tape or a pressure-sensitive adhesive layer may be separately provided on the paste (the pressure-sensitive adhesive layer exposed to the outer peripheral portion of the pressure-sensitive adhesive sheet) with respect to the ring frame. The double-sided tape has a configuration of a pressure-sensitive adhesive layer, a core material, and a pressure-sensitive adhesive layer, and the pressure-sensitive adhesive layer in the double-sided tape is not particularly limited, and a pressure-sensitive adhesive such as a rubber-based pressure-sensitive adhesive, an acrylic pressure-sensitive adhesive, a silicone-based pressure-sensitive adhesive, or polyvinyl ether is used. The pressure-sensitive adhesive layer is attached to the ring frame on the outer peripheral portion at the time of production of a substrate with a chip described below. Preferred examples of the core material of the double-sided tape include a polyester film, a polypropylene film, a polycarbonate film, a polyimide film, a fluorine resin film, and a liquid crystal polymer film.

Figure 4:
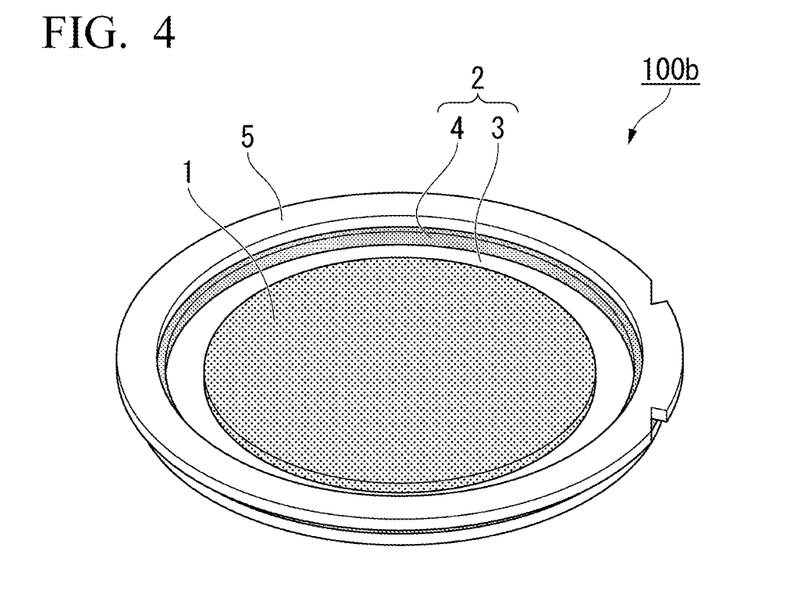
FIG. 4 is a perspective view schematically showing a state in which a film-shaped firing material with a support sheet according to an embodiment of the present invention is attached to a ring frame.

In the configuration example shown in FIG. 3, the ring-shaped pressure-sensitive adhesive layer 4 is formed on the outer peripheral portion of the base film 3 and is set as a pressure-sensitive adhesive portion. FIG. 4 is a perspective view showing the film-shaped firing material with a support sheet 100b shown in FIG. 3. At this time, the pressure-sensitive adhesive layer 4 may be a single pressure-sensitive adhesive layer formed of the above-described pressure-sensitive adhesive or may be obtained by circularly cutting double-sided pressure-sensitive adhesive tape containing a pressure-sensitive adhesive layer formed of the above-described pressure-sensitive adhesive. The film-shaped firing material 1 is peelably laminated on the inner peripheral portion of the base film 3 enclosed by the pressure-sensitive adhesive portion. In this configuration example, it is preferable that the film-shaped firing material 1 having a diameter smaller than the diameter of the support sheet 2 is concentrically and peelably laminated on the base film 3 of the support sheet 2.

A release film may be provided on the film-shaped firing material with a support sheet for the purpose of surface protection in order to avoid contact of any one or both surfaces of the film-shaped firing material and the pressure-sensitive adhesive portion with the outside until the material is provided for use.

The surface protective film (release film) can be obtained by performing the above-described peeling treatment on the surface of the base film such as polyethylene, polyethylene terephthalate, polybutylene terephthalate, polyethylene naphthalate, or polypropylene using a release agent. Examples of the release agent used for the peeling treatment include the release agents provided as exemplary examples in the section of the base film.

The thickness of the film-shaped firing material with a support sheet is preferably in a range of 1 to 500 μm, more preferably in a range of 5 to 300 μm, and still more preferably in a range of 10 to 150 μm.

Here, the "thickness of the film-shaped firing material with a support sheet" indicates the thickness of the entire film-shaped firing material with a support sheet. For example, the thickness of the film-shaped firing material with a support sheet formed of a plurality of layers indicates the total thickness of all layers constituting the film-shaped firing material with a support sheet.

«Method of Producing Film-Shaped Firing Material with a Support Sheet»

The film-shaped firing material with a support sheet can be produced by sequentially laminating the above-described respective layers so as to have the corresponding positional relationship.

For example, in a case where the pressure-sensitive adhesive layer or the film-shaped firing material is laminated on the base film, the release film is coated or printed with the pressure-sensitive adhesive composition or firing material composition containing a component and a solvent for constituting the pressure-sensitive adhesive layer or the film-shaped firing material, the composition is dried as necessary to volatilize the solvent and obtain a film shape, the pressure-sensitive adhesive layer or the film-shaped firing material is formed on the release film in advance, and the surface of the base film is attached to the exposed surface of the pressure-sensitive adhesive layer or film-shaped firing material after completion of the above-described formation on a side opposite to a side where the release film is provided. At this time, it is preferable that the surface of the release film on which the peeling treatment has been performed is coated or printed with the pressure-sensitive adhesive composition or firing material composition. The release film may be removed after formation of the laminated structure as necessary. The total amount of the respective components for constituting the pressure-sensitive adhesive composition or the firing material composition may be in a range of 50% to 99% by mass, and the amount of the solvent may be in a range of 1% to 50% by mass.

For example, in a case where a film-shaped firing material with a support sheet (a film-shaped firing material with a support sheet, in which the support sheet is a laminate of the base film and the pressure-sensitive adhesive layer) formed by laminating the pressure-sensitive adhesive layer on the base film and laminating the film-shaped firing material on the pressure-sensitive adhesive layer is produced, the pressure-sensitive adhesive layer is laminated on the base film according to the above-described method, the release film is separately coated or printed with the firing material composition containing a component and a solvent for constituting the film-shaped firing material, the composition is dried as necessary to volatilize the solvent and obtain a film shape so that the film-shaped firing material is formed on the release film, the exposed surface of this film-shaped firing material is attached to the exposed surface of the pressure-sensitive adhesive layer after being laminated on the base material, and the film-shaped firing material is laminated on the pressure-sensitive adhesive layer, thereby obtaining a film-shaped firing material with a support sheet. Even in a case where the film-shaped firing material is formed on the release film, it is preferable that the surface of the release film on which the peeling treatment has been performed is coated or printed with the firing material composition, and the release film may be removed after formation of the laminated structure as necessary.

As described above, since all layers other than the base material constituting the film-shaped firing material with a support sheet can be formed on the release film in advance and laminated using a method of bonding the layers to the surface of a target layer, the film-shaped firing material with a support sheet may be produced by appropriately selecting a layer that employs such a step as necessary.

Further, the film-shaped firing material with a support sheet may be stored in a state in which all the required layers are provided and then the release film is attached to the surface of the outermost layer on a side opposite to the support sheet.

«Method of Producing Substrate with Chip»

Next, a method of utilizing the film-shaped firing material with a support sheet according to the present invention will be described based on an example of a case where the firing material is used for production of a substrate with a chip.

According to the embodiment of the present invention, the method of producing a substrate with a chip obtained by using the film-shaped firing material with a support sheet is performed by peeling the release film off from the film-shaped firing material with a support sheet and attaching the film-shaped firing material with a support sheet to the rear surface of a semiconductor wafer (workpiece). The following steps (1) and (2) may be performed in order of the step (1) and the step (2), and the following steps (1) to (4) may be performed in order of the step (1), the step (2), the step (3), and the step (4).

Step (1): a step of dicing the semiconductor wafer (workpiece) and the film-shaped firing material of the laminate formed by sequentially laminating the support sheet, the film-shaped firing material, and the semiconductor wafer (workpiece);

Step (2): a step of peeling the support sheet off from the film-shaped firing material to obtain a chip with the film-shaped firing material;

Step (3): a step of attaching the chip with the film-shaped firing material to the surface of a substrate; and Step (4): a step of firing the film-shaped firing material and bonding the chip and the substrate Hereinafter, a case of performing the steps (1) to (4) will be described.

The semiconductor wafer may be a silicon wafer or a silicon carbide wafer or may be a compound semiconductor wafer such as gallium arsenic. A circuit may be formed on the surface of the semiconductor wafer. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 μm. Next, a fractured layer generated during the grinding of the rear surface is removed as necessary. The fractured layer is removed by performing chemical etching, plasma etching, or the like.

Next, the film-shaped firing material of the film-shaped firing material with a support sheet is attached to the rear surface of the semiconductor wafer. Thereafter, the steps (1) to (4) are performed in order of the step (1), the step (2), the step (3), and the step (4).

The laminate of the semiconductor wafer, the film-shaped firing material, and the support sheet is diced for each circuit formed on the surface of the wafer to obtain a laminate of the chip, the film-shaped firing material, and the support sheet. The dicing is performed by cutting the semiconductor wafer and the film-shaped firing material simultaneously. According to the film-shaped firing material with a support sheet according to the present embodiment, since the adhesive force is exhibited between the film-shaped firing material and the support sheet during the dicing, chipping and chip jump can be prevented. Therefore, the dicing adaptability is excellent. The dicing is not particularly limited, and a method of fixing the peripheral portion (an outer peripheral portion of a support) of the support sheet with the ring frame at the time of dicing the semiconductor wafer and dividing the semiconductor wafer according to a known technique of using a rotary round blade such as a dicing blade is an exemplary example of the dicing method. The film-shaped firing material may be completely cut, and the cut depth of the support sheet resulting from dicing is preferably in a range of 0 to 30 μm from the interface between the film-shaped firing material and the support sheet. By decreasing the amount of the support sheet to be cut, it is possible to suppress fusing of the pressure-sensitive adhesive layer or the base film constituting the support sheet caused by the friction of the dicing blade or generation of burrs and the like.

Further, particularly a chip obtained by dividing the semiconductor wafer having a surface on which a circuit is formed is also referred to as an element or a semiconductor element.

Thereafter, the support sheet may be expanded. In a case where a base film having excellent extensibility is selected as the base film of the support sheet, the support sheet has excellent expandability. By picking up the diced chips with the film-shaped firing material by general means such as a collet, the film-shaped firing material and the support sheet are peeled from each other. As a result, a chip (a chip with the film-shaped firing material) having a film-shaped firing material on the rear surface is obtained.

Next, the chip with the film-shaped firing material is attached to the surface of the substrate. The substrate includes a lead frame, a heat sink, and the like.

Next, the film-shaped firing material is fired so that the substrate and the chip are sinter-bonded. At this time, in a case where the exposed surface of the film-shaped firing material of the chip with the film-shaped firing material is attached to the substrate, the chip and the substrate can be sinter-bonded through the film-shaped firing material.

The heating temperature of firing the film-shaped firing material may be appropriately determined in consideration of the kind and the like of the film-shaped firing material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped firing material, but is preferably in a range of 1 second to 60 minutes, more preferably in a range of 1 second to 30 minutes, and still more preferably in a range of 1 second to 10 minutes.

The film-shaped firing material may be fired by performing pressurizing and firing, in which the film-shaped firing material is fired by being pressurized. The condition for pressurization can be set to be, for example, in a range of 1 to 50 MPa.

According to the method of producing the substrate with a chip of the present embodiment, the film-shaped firing material with a highly uniform thickness can be simply formed on the rear surface of the chip, and cracks after the dicing step or the packing are unlikely to be generated. Further, according to the method of producing the substrate with a chip of the present embodiment, the chip with the film-shaped firing material can be obtained without separately attaching the film-shaped firing material to the rear surface of the divided chip, and thus the production step can be simplified. Further, a substrate with a chip in which the chip and the substrate are sinter-bonded through the film-shaped firing material by disposing the chip with the film-shaped firing material on a desired substrate and firing the substrate and the chip can be produced.

As an embodiment, a chip with the film-shaped firing material which includes a chip and the film-shaped firing material according to the present invention is obtained. As an example, the chip with the film-shaped firing material can be produced according to the method of producing the substrate with a chip described above.

Further, in the above-described embodiment, the example of the sinter bonding between the chip and the substrate of the film-shaped firing material has been described, but the target for the sinter bonding of the film-shaped firing material is not limited to the example described above, and the sinter bonding can be performed on various products sintered in contact with the film-shaped firing material.

Further, according to the above-described embodiment, the film-shaped firing material having the same shape as the shape of chip can be processed by being divided together with the semiconductor wafer using a blade or the like, and a chip with the film-shaped firing material can be produced. That is, in the chip with the film-shaped firing material, the size (area) of the contact surface of the film-shaped firing material is the same as the size of the contact surface of the chip, but these may be different from each other. For example, the substrate and the chip may be attached to each other through the film-shaped firing material in a state in which the contact surface of the film-shaped firing material is larger than the contact surface of the chip. Specifically, the film-shaped firing material having a desired size is disposed on the substrate, and the chip having a contact surface smaller than that of the film-shaped firing material may be attached to the film-shaped firing material.

EXAMPLES

Hereinafter, the present invention will be described in detail based on the examples, and the scope of the present invention is not limited to these examples and the like.

Examples 1 to 5 and Comparative Examples 1 and 2

<Production of Firing Material Composition>

A total of 95 parts by mass of the first metal particles and the second metal particles of the type listed in Table 1 and 5 parts by mass of a binder component (2-ethylhexyl methacrylate polymer, mass average molecular weight of 260000, L-0818, manufactured by The Nippon Synthetic Chemical Industry Co., Ltd., MEK diluted product, solid amount of 58.4% by mass, Tg of −10° C.) in terms of the solid content were mixed and diluted with a solvent (butyl carbitol) until the solid content concentration thereof reached 75% by mass, thereby obtaining a firing material composition.

The first metal particles and the second metal particles were mixed such that the mass ratio of the first metal particles to the second metal particles reached the value listed in Table 1.

Further, the particle diameter of the first metal particles was measured using a TEM, and the particle diameter of the second metal particles was measured using a SEM.

<Production of Film-Shaped Firing Material>

One surface of a release film (SP-PET 381031, manufactured by Lintec Corporation, thickness of 38 μm) serving as a polyethylene terephthalate-based film whose one surface had been subjected to a peeling treatment was coated with the firing material composition obtained in the above-described manner and dried at 110° C. for 10 minutes, thereby obtaining a film-shaped firing material having a thickness of 75 μm.

<Method of Separating Components Excluding First Metal Particles and Second Metal Particles from Film-Shaped Firing Material>

After the film-shaped firing material before being fired was mixed into an organic solvent in an amount of approximately 10 times the weight of the material, the solution was allowed to stand for approximately 30 minutes until the first metal particles and the second metal particles were precipitated. Components excluding the first metal particles and the second metal particles from the film-shaped firing material were collected by removing the supernatant using a syringe and recovering the residues after the drying at 120° C. for 10 minutes. Moreover, the organic solvent having an amount of approximately 10 times the amount of the film-shaped firing material was mixed again with the liquid containing the first metal particles and the second metal particles after the supernatant was removed using the syringe, the resulting solution was allowed to stand for approximately 30 minutes until the first metal particles and the second metal particles are precipitated, and the supernatant was removed using a syringe. The first metal particles and the second metal particles were collected by repeatedly performing the mixing of the organic solvent, the standing, and the removing of the supernatant five times, drying the remaining solution at 120° C. for 10 minutes, and recovering the residues.

<Measurement and Evaluation of Firing Material Composition and Film-Shaped Firing Material>

The following items of the obtained firing material compositions and film-shaped firing materials were measured and evaluated.

(Confirmation of Dispersion State)

The firing material compositions and the film-shaped firing materials were visually observed to confirm the presence or absence of aggregates.

A case where aggregates were not found from any of the firing material composition and the film-shaped firing material was determined as "A: satisfactory dispersion state". A case where aggregates were found from at least one of the firing material composition and the film-shaped firing material was determined as "B: poor dispersion state". The results are listed in Table 1.

(Measurement of Thickness)

The thickness of the film-shaped firing material was measured using a constant pressure thickness-measuring device (product name: "PG-02", manufactured by Techlock, Inc.) in conformity with JIS K 7130.

(Measurement of Thermal Conductivity)

The thermal conductivity of the film-shaped firing material after the firing was measured according to the following method.

The film-shaped firing material obtained in the above-described manner was cut into a size of 10 mm×10 mm, and the cut sheets were laminated such that the thickness after the firing was set to approximately 150 μm, thereby obtaining a laminate (1). An aluminum sheet having a thickness of 100 μm and an area of 20 mm×20 mm was attached to both surfaces of the obtained laminate (1), thereby obtaining a laminate (2). The obtained laminate (2) was interposed between a cylindrical copper piece having a height of 5 mm and having a cross section with a diameter of 10 mm and a cylindrical copper piece having a height of 2 mm and having a cross section with a diameter of 5 mm and pressurized and fired for 3 minutes under conditions of 350° C. at 10 MPa in a nitrogen atmosphere, thereby obtaining a fired body interposed between two aluminum sheets. Next, two aluminum sheets were peeled off from the fired body to obtain a test piece for measuring the thermal conductivity. The thickness of the laminated film-shaped firing material before the firing was roughly determined based on the volume ratio of the metal particles in the film-shaped firing material, and a value obtained by dividing 150 μm by the volume ratio of the metal particles in the film-shaped firing material serves as an indicator of the thickness of the laminated film-shaped firing material before the firing.

Next, the thermal diffusivity of the test piece was measured using a thermal conductivity measuring device (product name, "ai-Phase Mobile 1u" manufactured by ai-Phase Co., Ltd.), and the thermal conductivity of the test piece was calculated based on the specific heat and the specific gravity of the test piece. The measurement was performed several times, and five or more points were selected from those excluding measured values that were largely different from other values so that the standard deviation was less than half the average value, and the average value thereof was set as the thermal conductivity of the film-shaped firing material after the firing. The results are listed in Table 1.

(Measurement of Shear Adhesive Force)

The shear adhesive force of the film-shaped firing material after the firing was measured according to the following method.

The film-shaped firing material obtained in the above-described manner was cut into a size of 10 mm×10 mm and attached to the upper surface of a cylindrical copper adherend having a height of 5 mm and having a cross section with a diameter of 10 mm, a cylindrical copper adherend having a height of 2 mm and having a cross section with a diameter of 5 mm was placed thereon, and the resultant was pressurized and fired for 3 minutes under conditions of 350° C. at 10 MPa in a nitrogen atmosphere, thereby obtaining a test piece for measuring a bonding adhesive force. A force was applied to the adhesive surface of the test piece at room temperature in the shear direction at a speed of 6 mm/min, the strength at which the adhesion state was broken was measured, and the result was set as the shear adhesive force. The results are listed in Table 1.

TABLE 1

|  |  | Example 1 | Example 2 | Example 3 | Example 4 | Example 5 | Comparative Example 1 | Comparative Example 2 |
| --- | --- | --- | --- | --- | --- | --- | --- | --- |
| First metal particles | Metal species | Silver | Silver | Silver | Silver | Silver | Silver | Silver |
|  | Average particle diameter [nm] | 40 | 40 | 40 | 65 | 40 | 40 | 40 |
|  | Minimum particle diameter [nm] | 20 | 20 | 20 | 35 | 20 | 20 | 20 |
|  | Maximum particle diameter [nm] | 95 | 95 | 95 | 210 | 95 | 95 | 95 |
| Second metal particles | Metal species | Copper | Copper | Copper | Copper | Copper | Copper | Copper |
|  | Average particle diameter [nm] | 3500 | 3500 | 3500 | 5000 | 3500 | 15000 | 3500 |
|  | Minimum particle diameter [nm] | 500 | 500 | 500 | 900 | 700 | 3500 | 500 |
|  | Maximum particle diameter [nm] | 7000 | 7000 | 7000 | 8900 | 6500 | 45000 | 7000 |
|  | Mass ratio (first metal particles/second metal particles) | 0.2 | 3.0 | 8.5 | 3.0 | 3.0 | 3.0 | 0.08 |
| Evaluation | Dispersion state | A | A | A | A | A | B | B |
|  | Thermal conductivity [W/(m · K)] | 310 | 330 | 300 | 290 | 330 | 120 | 110 |
|  | Shear adhesive force [MPa] | 43 | 66 | 75 | 56 | 61 | 21 | 20 |

As is clear in Table 1, the film-shaped firing materials of Examples 1 to 5 had excellent thermal conductivity and exhibited a high shear adhesive force as compared to the film-shaped firing materials of Comparative Examples 1 and 2.

Each configuration in each embodiment and the combination thereof are merely examples, and addition, omission, substitution, and other modification of configurations can be made within a range not departing from the scope of the present invention. Further, the present invention is not limited to the embodiments and only limited by the scope of the claims.

REFERENCE SIGNS LIST

1 Film-shaped firing material
2 Support sheet
3 Base film
4 Pressure-sensitive adhesive layer
5 Ring frame
10 First metal particle
20 Second metal particle
30 Binder component
100a Film-shaped firing material with a support sheet
100b Film-shaped firing material with a support sheet

The invention claimed is:
1. A film-shaped firing material comprising:
first metal particles;
second metal particles; and
a binder component,
wherein the average particle diameter of the first metal particles is 100 nm or less, and the maximum particle diameter thereof is 250 nm or less,
the average particle diameter of the second metal particles is in a range of 3500 to 6000 nm, the minimum particle diameter thereof is greater than 250 nm, and the maximum particle diameter thereof is 10000 nm or less, the mass ratio of the first metal particles to the second metal particles is 0.1 or greater, and the fired film-shaped firing material has a high thermal conductivity and exhibits a high shear adhesive force.

2. A film-shaped firing material with a support sheet comprising:

the film-shaped firing material according to claim 1; and a support sheet which is provided on at least one side of the film-shaped firing material.

3. The film-shaped firing material with a support sheet according to claim 2, wherein the support sheet includes a pressure-sensitive adhesive layer provided on a base film, and the film-shaped firing material is provided on the pressure-sensitive adhesive layer.

4. A film-shaped firing material according to claim 1;

wherein the mass ratio of the first metal particles to the second metal particles is in a range of 0.2 to 25.

\* \* \* \* \*